United States Patent
Krishna

(10) Patent No.: US 9,973,179 B2
(45) Date of Patent: *May 15, 2018

(54) SENSE AMPLIFIER LATCH WITH OFFSET CORRECTION

(71) Applicant: Texas Instruments Incorporated, Dallas, TX (US)

(72) Inventor: Kannan Krishna, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/483,670

(22) Filed: Apr. 10, 2017

(65) Prior Publication Data

US 2017/0214396 A1 Jul. 27, 2017

Related U.S. Application Data

(63) Continuation of application No. 15/153,028, filed on May 12, 2016, now Pat. No. 9,621,145.

(60) Provisional application No. 62/274,017, filed on Dec. 31, 2015, provisional application No. 62/160,430, filed on May 12, 2015.

(51) Int. Cl.
   G01R 19/00 (2006.01)
   H03K 5/003 (2006.01)
   H03K 5/24 (2006.01)
   H03K 3/356 (2006.01)

(52) U.S. Cl.
   CPC ....... *H03K 5/003* (2013.01); *H03K 3/356104* (2013.01); *H03K 5/2481* (2013.01)

(58) Field of Classification Search
   CPC ............................. H03K 5/003; H03K 5/2481
   See application file for complete search history.

(56) References Cited

U.S. PATENT DOCUMENTS

| 5,182,560 A | 1/1993 | Shiwaku | |
|---|---|---|---|
| 9,621,145 B2* | 4/2017 | Krishna | ............... H03K 5/2481 |
| 2015/0016183 A1* | 1/2015 | Sinangil | .................. G11C 7/065 |
| | | | 365/156 |
| 2016/0093350 A1* | 3/2016 | Jung | .................... G11C 11/1673 |
| | | | 365/158 |

OTHER PUBLICATIONS

Prosecution History from U.S. Appl. No. 15/153,028, dated May 12, 2016 to Mar. 23, 2017, 94 pages.

* cited by examiner

*Primary Examiner* — Daniel Puentes
(74) *Attorney, Agent, or Firm* — John R. Pessetto; Charles A. Brill; Frank D. Cimino

(57) ABSTRACT

A method and device for input offset cancellation utilizing a latched comparator that is configurable as a linear amplifier capable of sampling and cancelling offset in the inputs to the latched comparator. The latched comparator is configured according to three control signals for operation in three operating intervals. During a first operating interval, the latched comparator is configured as a linear amplifier that samples the offset at the inputs to the latched comparator. Based on the sampled offset, the linear amplifier cancels the offset in the inputs to the latched comparator. During a second operating interval, the latched comparator reverts to operation as comparator and the inputs to the latch are reset. During a third interval, the latch resolves the inputs to the comparator and generates an output signal indicating.

8 Claims, 5 Drawing Sheets

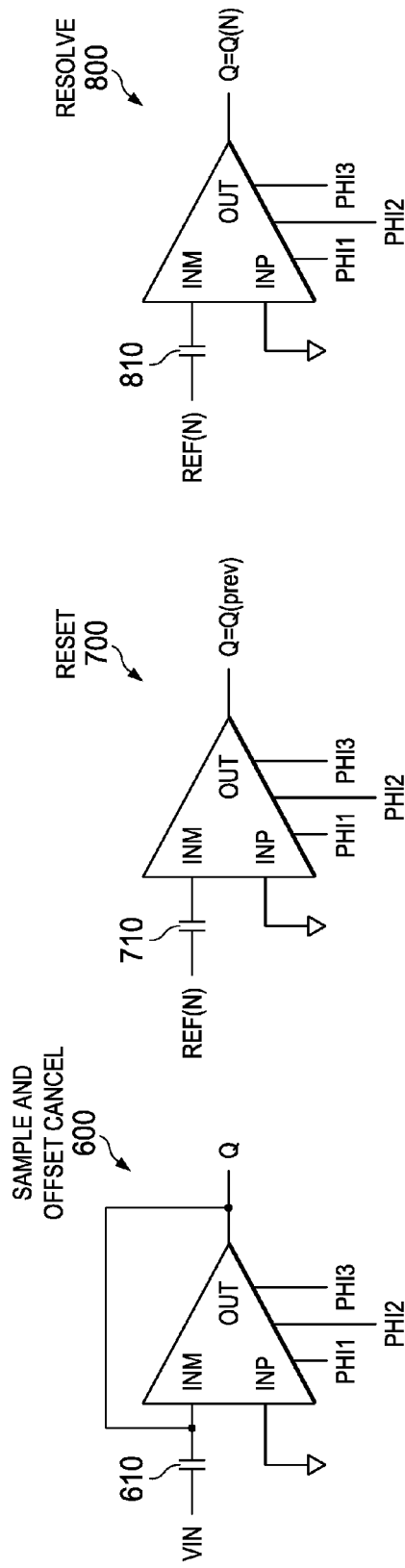
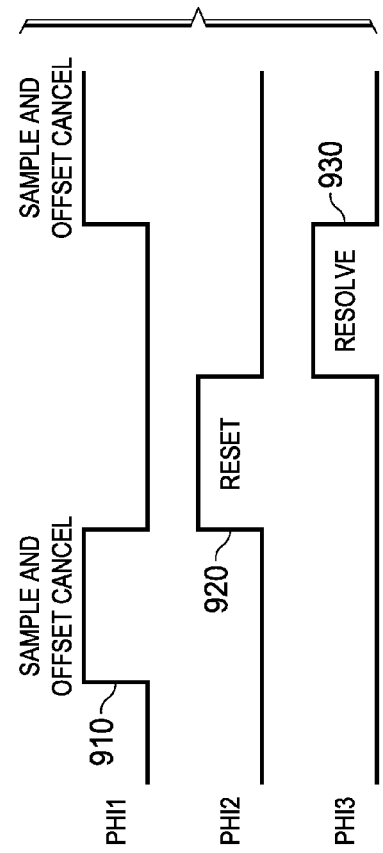
FIG. 6
FIG. 7
FIG. 8
FIG. 9

SENSE AMPLIFIER LATCH WITH OFFSET CORRECTION

CROSS-REFERENCE TO RELATED APPLICATIONS

This application is a continuation of U.S. patent application Ser. No. 15/153,028, filed May 12, 2016, which claims the benefit of U.S. Provisional Application No. 62/274,017, filed Dec. 31, 2015, and the benefit of U.S. Provisional Application No. 62/160,430, filed May 12, 2015, all of which are hereby incorporated herein by reference in their entirety.

TECHNICAL FIELD

The recited claims are directed, in general, to input offset cancellation and, more specifically, to the input offset cancellation in a comparator.

BACKGROUND

Various comparator logic circuits have been developed that can be used to compare two analog input signals and providing a digital output signal indicating which of the two input signals is larger. Comparators are non-linear circuits commonly used to digitize analog signals. The comparator may be combined with a latch, in order to store the value of the digital output resolved by the comparator. Used in this manner, latched comparators are used as components of analog-to-digital converters (ADCs) in a variety of applications.

In order to adapt a latched comparator such that it can evaluate low voltage inputs and generate a relatively large output signal, a latched comparator may be combined with an amplifier. Preceding the latched comparator, the preamplifier provides gain. The combined amplifier based comparator may be used in in memory devices for sensing the voltage of an individual memory cell and providing a digitized logical output representing the state of the memory cell.

An amplifier based comparator consists of pairs of complimentary transistors. Manufacturing variances in these transistors results in an input offset voltage that affects the operation of the amplifier based comparator. Such variances in the preamplifier may be amplified, such that the offset of the preamplifier dominates any offset present in the comparator. The input offset voltage reflects that additional input voltage that must be applied due to these manufacturing variances in order to trigger a change in state in the output of the sense amplifier based comparator. This offset changes the analog value at which the output of a comparator changes from zero to one, thus degrading the accuracy of the sense amplifier based comparator. The greater the offset, the greater the impact on the range of the sense amplifier based comparator. This offset may be accounted for using conventional techniques that cancel the offset.

Conventional input offset cancellation methods may effectively reduce offset, but do so at the expense of speed. In additional to reducing the operating speed of the circuit, conventional input offset cancellation techniques may increase the die area required by the circuit, increase the power requirements of the circuit and/or reduce the range of the inputs to the sense amplifier based comparator.

SUMMARY OF THE INVENTION

A method and device for input offset cancellation in a latched comparator with differential inputs according to various embodiments are disclosed. During a first interval, the latched comparator is configured as a linear amplifier; the configured linear amplifier samples the offset in the differential inputs to the latched comparator, the sampling indicating an first offset amount; and the configured linear amplifier cancels the first offset amount in the differential inputs to the latched comparator. During a second interval, the configuration of the latched comparator as a non-linear amplifier is reverted and the inputs to a latch component of the latched comparator are reset. During a third interval, the value of the inputs to the latch component are resolved.

According to various additional embodiments, the latched comparator operates based on a first control signal, a second control signal and a third control signal. According to various additional embodiments, the offset is sampled by a first capacitor of the latched comparator. According to various additional embodiments, the first capacitor is charged using a negative feedback loop of the latched comparator. According to various additional embodiments, the charge of the first capacitor indicates the first offset amount. According to various additional embodiments, the sampling of the offset is concurrent with the cancelling of the first offset amount. According to various additional embodiments, the first control signal directs the latched comparator to operate in the first interval. According to various additional embodiments, the second control signal directs the latched comparator to operate in the second interval. According to various additional embodiments, the third control signal directs the latched comparator to operate in the third interval. According to various additional embodiments, during a fourth interval, residual offset is cancelled based on a stored residual offset measurement.

BRIEF DESCRIPTION OF THE DRAWINGS

Figure 1:
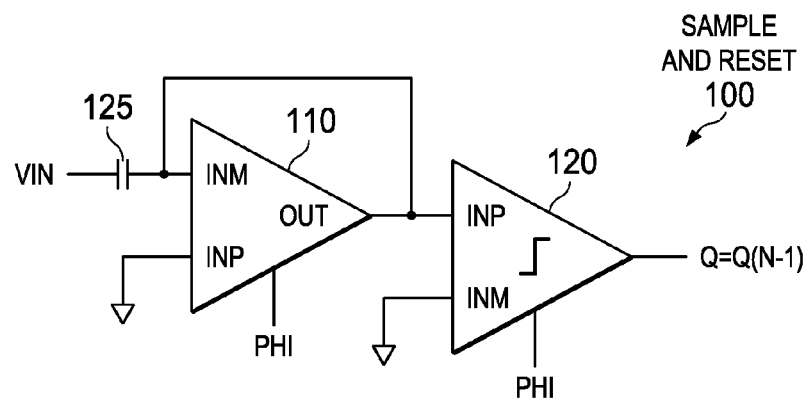

Having thus described the invention in general terms, reference will now be made to the accompanying drawings, wherein:

FIG. 1 is a schematic block diagram illustrating one aspect of conventional input offset cancellation in a amplifier based comparator.

Figure 2:
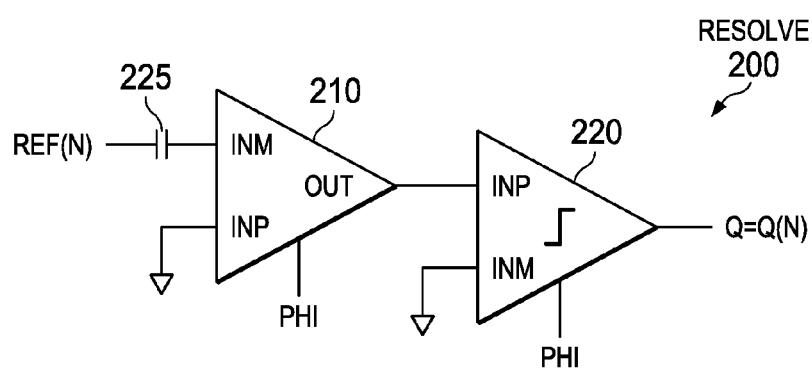

FIG. 2 is a schematic block diagram illustrating another aspect of conventional input offset cancellation in a amplifier based comparator.

Figure 3:
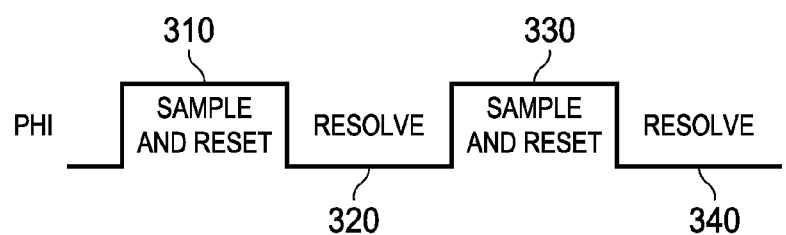

FIG. 3 is a waveform diagram illustrating the operation of an amplifier-based comparator in conventional input offset cancellation.

Figure 4:
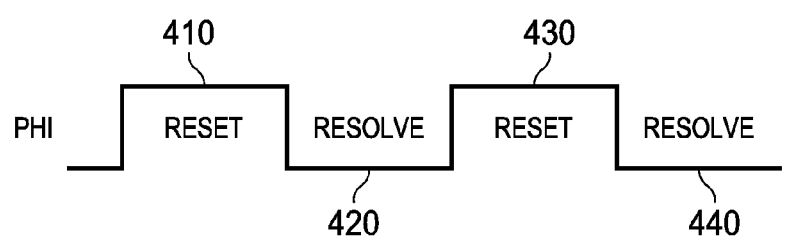

FIG. 4 is a waveform diagram illustrating the operation of a more detailed sense amplifier based comparator without input offset cancellation.

Figure 5:
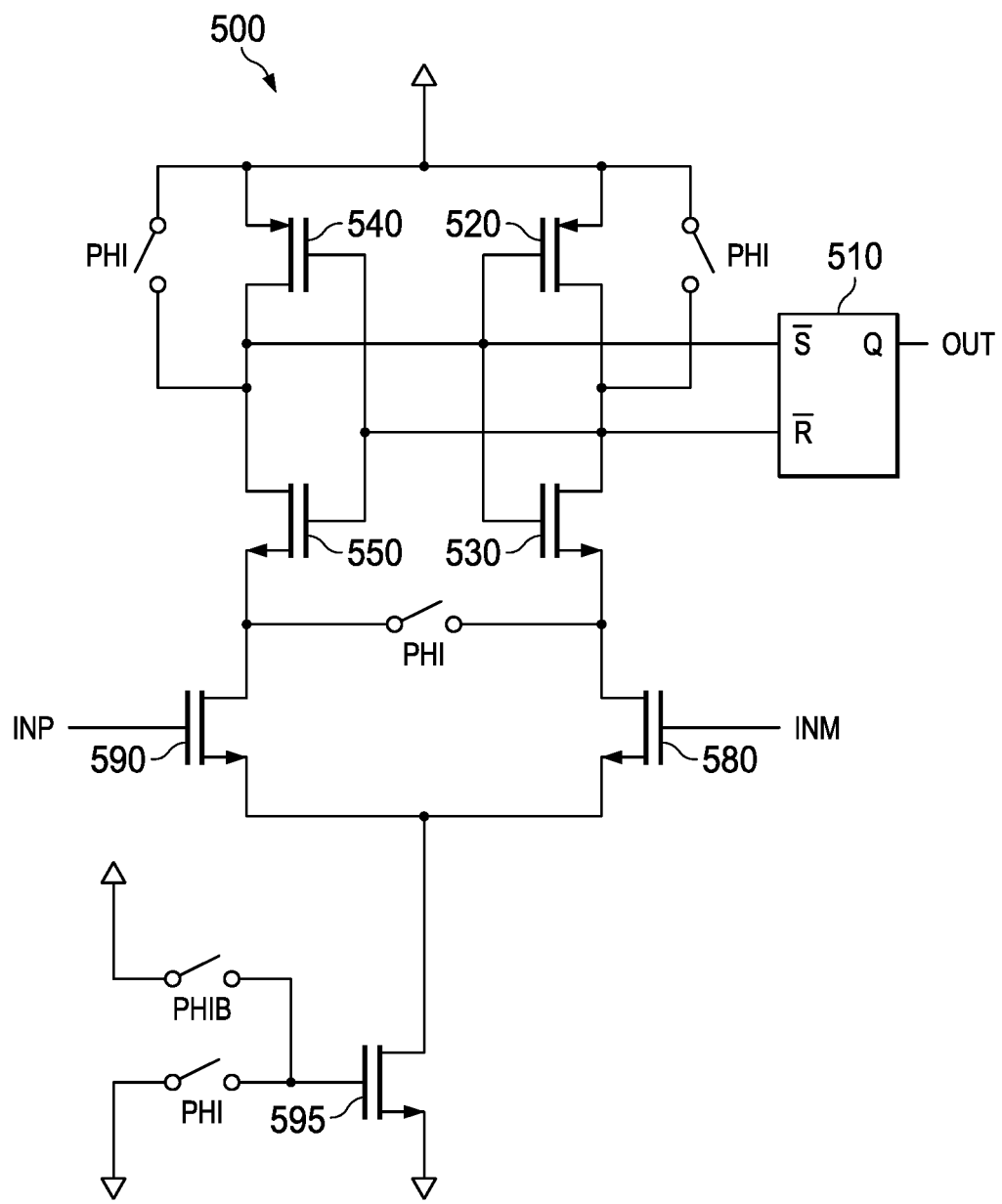

FIG. 5 is a schematic circuit diagram illustrating a sense amplifier based comparator that does not utilize input offset cancellation.

FIG. 6 is a schematic block diagram illustrating one aspect of input offset cancellation according to various embodiments.

FIG. 7 is a schematic block diagram illustrating another aspect of input offset cancellation according to various embodiments.

FIG. 8 is a schematic block diagram illustrating another aspect of input offset cancellation according to various embodiments.

FIG. 9 is a waveform diagram illustrating the operation of a latched comparator utilizing input offset cancellation according to various embodiments.

Figure 10:
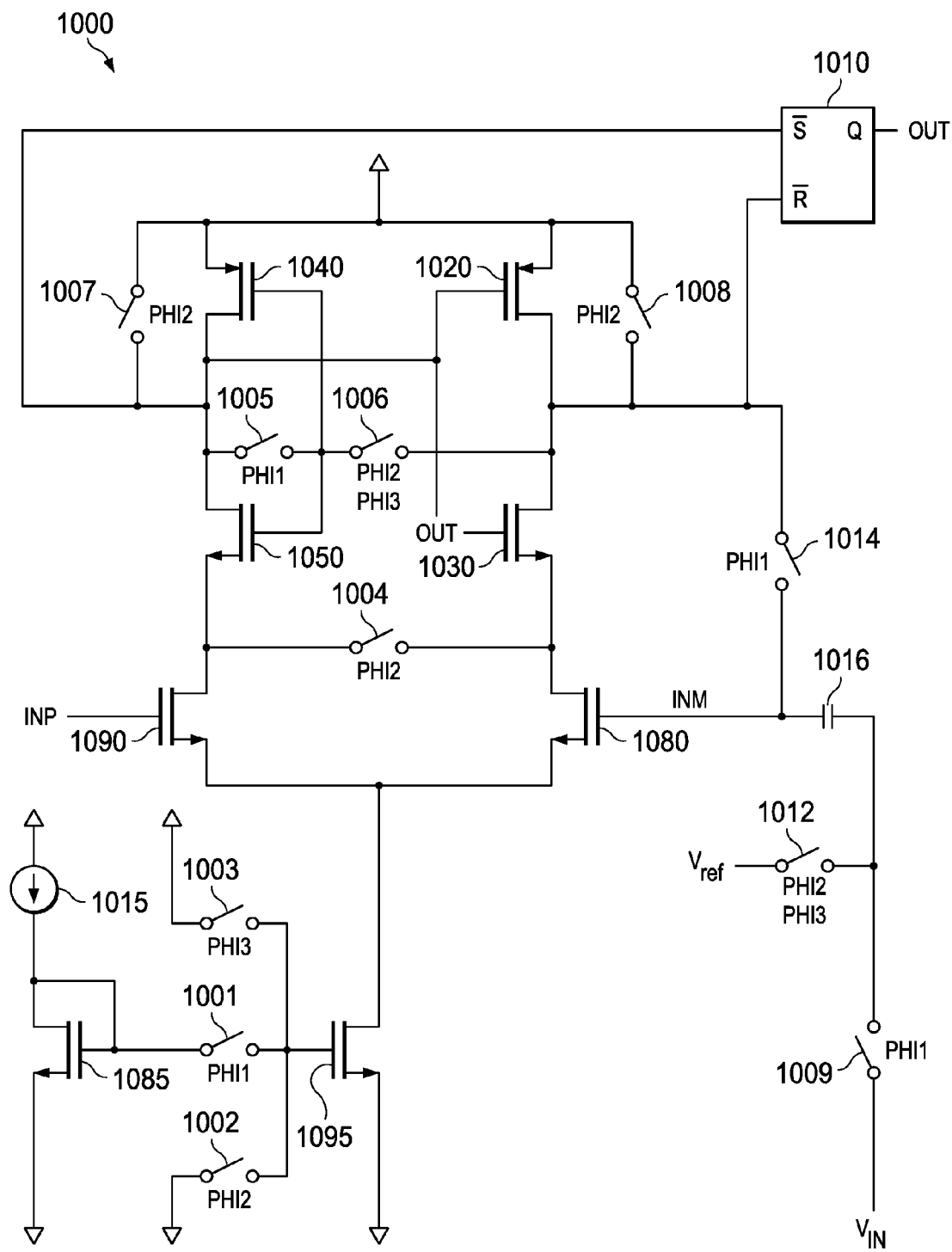

FIG. 10 is a schematic circuit diagram illustrating a configurable latched comparator that utilizes input offset cancellation according to various embodiments.

Figure 11:
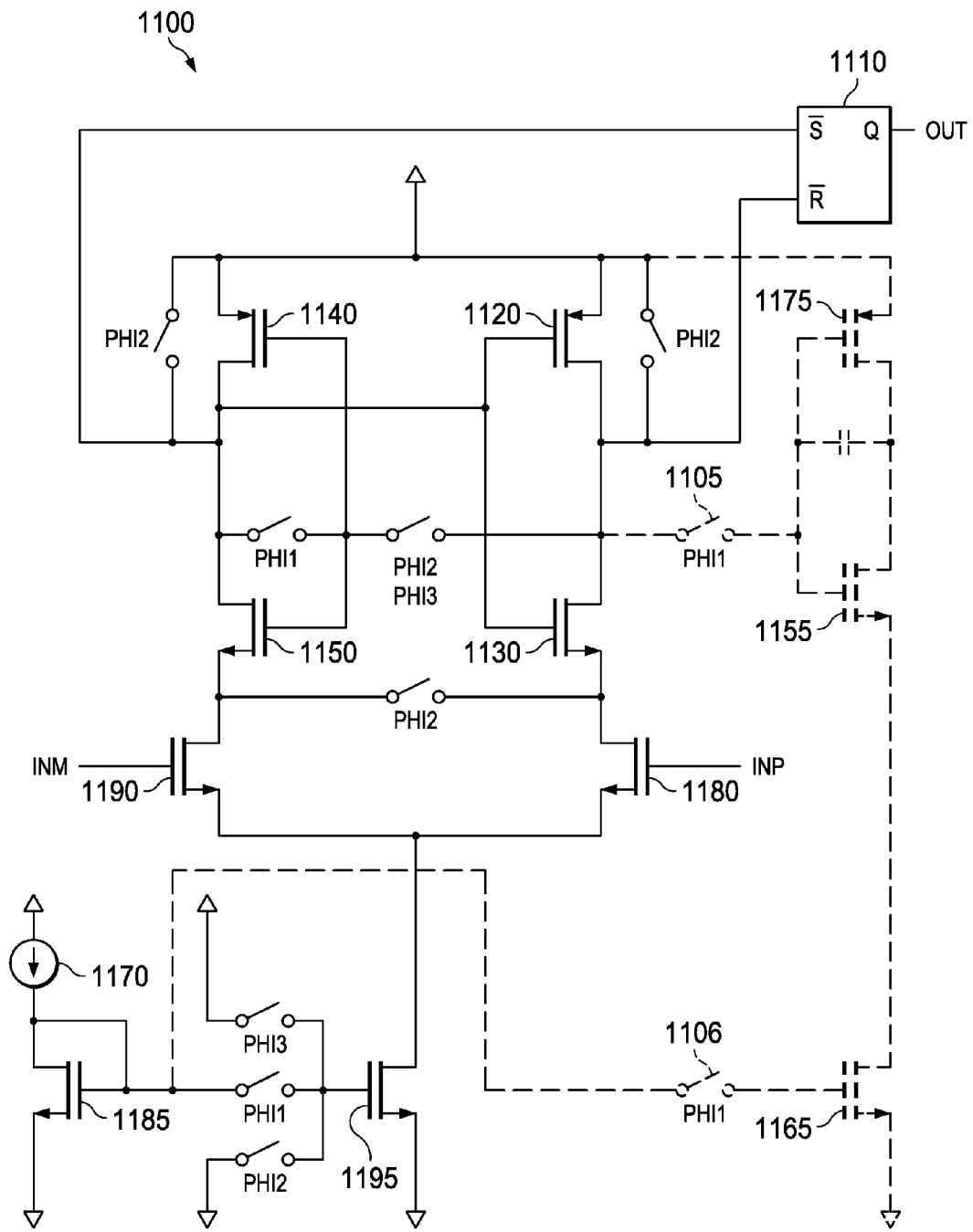

FIG. 11 is a schematic circuit diagram illustrating a configurable latched comparator that utilizes input offset cancellation according to various additional embodiments.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 illustrates one aspect of a conventional input offset cancellation technique implemented in an amplifier based comparator 100. A linear preamplifier 110 serves as a first stage of the amplifier based comparator 100 and a latched comparator 120 serves as a second stage. The preamplifier 110 has two input terminals, INM and INP. The INM input terminal preamplifier 110 is connected to an input voltage, $V_{IN}$. The INP input terminal of preamplifier 110 is grounded, thus configuring the preamplifier 110 to amplify the difference between INM input and ground. The operation of the preamplifier 110 is determined by a control signal, PHI. The amplified output of the preamplifier 110 is provided as an input to the latched comparator 120.

The latched comparator 120 determines if the amplified input, INP, received from the preamplifier 110 is greater than the reference voltage input, INM. In the latched comparator 120, the reference voltage input, INM, is grounded. The latched comparator 120 utilizes a latch mechanism to store the results of this comparison between the INP and INM input voltages. The latched comparator 120 stores a high or low value depending on the outcome of this comparison, with the stored value provided as an output digital signal, Q, by the latched comparator. Like the preamplifier 110, the operation of the latched comparator 120 is also determined by a control signal, PHI.

FIG. 3 illustrates input offset cancellation implemented in the conventional sense amplifier based comparator 100. FIG. 3 depicts a waveform of the control signal, PHI, that is provided as an input to both preamplifier 110 and latched comparator 120. FIG. 3 also depicts the operating state of the input offset cancellation technique based on the state of the control signal, PHI. When the PHI control signal is high, such as during intervals 310 and 330 depicted in FIG. 3, the latched comparator is reset, if necessary, and the offset of preamplifier 110 is sampled. As illustrated in FIG. 1, during such intervals, the preamplifier 110 is configured as a unity gain feedback amplifier, such that the offset voltage that is output by preamplifier 110 is stored in capacitor 125. When the PHI control signal goes low, such as during intervals 320 and 340, the latched comparator 220 resolves whether the input, INP, is larger than the reference voltage, INM. As illustrated in FIG. 2, during these intervals where the latched comparator 220 is resolving the inputs, the preamplifier 210 is reconfigured as an open-loop amplifier. Configured in this manner, the offset stored in capacitors 125 is thus subtracted from the input signal INM, thus canceling the offset from the output, OUT, of the preamplifier 110.

Using this conventional offset cancellation technique, the offset of preamplifier 110 is eliminated from the input provided to the latched comparator 120. The operating speed of the conventional offset cancellation technique is limited by the output slew rate of the preamplifier 110. Consequently, this conventional offset cancellation technique illustrated in FIGS. 1-3 results in a loss of speed. This form of conventional offset cancellation also requires additional power consumption and additional die area for the implementation of latched comparator in order to compensate for the loss in speed.

In another conventional form of input offset cancellation, a linear comparator is utilized rather than a linear preamplifier. The offset of the linear comparator is cancelled using input referred offset cancellation. This technique requires additional power and results in a greater speed loss than input offset cancelation technique of FIGS. 1-3.

In another conventional form of input offset cancellation in a latched comparator utilizes post-processing to cancel offset. The post-processing requires determining the magnitude of the offset of a latched comparator. The magnitude of the offset is stored and utilized during the operation of the comparator to subtract the offset from the values resolved by the latched comparator. This post-processing input offset cancellation technique results in a loss of range unless larger, slower components are utilized to provide more headroom.

FIGS. 4 and 5 illustrate a more detailed description of the operation of a conventional sense amplifier based comparator 500. FIG. 5 is circuit diagram of the latched comparator 500 aspect of a conventional sense amplifier based comparator. FIG. 4 illustrates the operation of the sense amplifier based comparator associated with the latched comparator 500. FIG. 4 depicts a waveform of the clocked control signal, PHI, that is provided as an input to the latched comparator. FIG. 4 also depicts the operating state of the latched comparator based on the state of the control signal, PHI. When the PHI control signal is high, such as during intervals 410 and 430 depicted in FIG. 4, the sense amplifier based comparator samples the values of inputs, INM and INP. When the PHI control signal is low, such as during intervals, 420 and 430, the latched comparator 500 resolves the value of the sampled inputs.

More specifically, the conventional sense amplifier based comparator 500 is a CMOS circuit that includes cross-coupled PMOS and NMOS transistors 520, 530, 540, 550 and a differential pair of input transistors 580 and 590. When the control signal, PHI, is high, such as during intervals 410 and 430, the inputs at terminals R and S to latch 510 are reset and the output of terminals R and S are re-sampled based on the values of inputs of terminals INM and INP that control transistors 580 and 590. When the control signal PHI is low, such as during intervals 420 and 440, the sampled output values at terminals R and S are resolved. If the voltage on input terminal INP is greater than the voltage on terminal INM, the S terminal is low and R terminal is high. When voltage on input terminal INP is less than the voltage on input terminal INM, the S terminal is high and the R terminal is low. Based on the state of the control signal PHI, transistor 595 couples and decouples the differential pair of transistors 580 and 590 to ground.

FIGS. 6-9 illustrate input offset cancellation using a configurable latched comparator according to various embodiments. In the illustrated embodiment of FIGS. 6-9 and in FIGS. 10-11, input offset cancellation is described with respect to a latched comparator. However, various embodiments may utilize the described cancellation of input offset in other types of comparators that utilize a clocked control signal. According to various embodiments, input offset cancellation is provided without the use of a dedicated preamplifier stage. Instead, input offset is cancelled in embodiments by re-configuring the latched comparator, which is a non-linear device, as a linear amplifier during an offset cancellation phase. Upon cancellation of the offset, the comparator reverts back to operating as a comparator. In this manner, embodiments provide the ability to cancel offset using a single, configurable comparator component.

FIGS. 6-8 illustrate input offset cancellation in a sense amplifier based latched comparator according to various embodiments. FIG. 9 depicts a waveform of three clocked control signal, PHI1, PHI2 and PHI3, that are provided as inputs to the sense amplifier based latched comparator. FIG. 9 also depicts the operating state transitions of the sense amplifier based latched comparator that result from the state of the control signals, PHI1, PHI2 and PHI3.

FIG. 6 depict one aspect of the operation of a sense amplifier based latched comparator 600 according to various embodiments. Unlike the conventional two-component system of FIGS. 1-2, the sense amplifier based latched comparator is a single component that both provides comparator functions and includes input offset cancellation capabilities. The sense amplifier based latched comparator 600 has two input terminals, INM and INP. The INM input terminal is connected to an input voltage, $V_{IN}$, via a capacitor 610. The INP input terminal is grounded. The operation of the sense amplifier based latched comparator 600 is determined by three control signals, PHI1, PHI2 and PHI3.

FIG. 9 illustrates input offset cancellation implemented by a sense amplifier based latched comparator according to embodiments such as described with respect to FIGS. 6-8. FIG. 9 depicts a waveform of the control signals, PHI1, PHI2 and PHI3, that are utilized as inputs to the sense amplifier based latched comparator of FIGS. 6-8. FIG. 9 also depicts the operating state of the recited input offset cancellation technique based on the states of the control signals, PHI1, PHI2 and PHI3.

When the PHI1 control signal is high, such as during interval 910 depicted in FIG. 9, the recited input offset cancellation technique begins and the offset between the INM and INP inputs is sampled. As illustrated in FIG. 6, the sense amplifier based latched comparator 600 is configured as a linear amplifier during interval 910 such that the offset between the INM and INP inputs is concurrently sampled and cancelled. The sense amplifier based latched comparator 600 is configured as a linear amplifier by connecting a negative feedback loop 620 to the INM input terminal. Via this feedback loop 620, the offset between the INM and INP input terminals is stored in capacitor 610, thus sampling the magnitude of the input offset of the sense amplifier based latched comparator 600. While still in interval 910, the sense amplifier based latched comparator 600 configured as a linear amplifier cancels the input offset between the INM and INP input terminals since the input to INM is equal to $V_{IN}$ minus the sampled offset stored by capacitor 610.

With reference to FIGS. 7 and 9, the PHI1 control signal goes low and the PHI2 control signal goes high during interval 920. During interval 920, the inputs to the latch component of the sense amplifier based latched comparator 700 are reset. As illustrated in FIG. 7, during this reset interval 920, the negative feedback loop that configures the latched comparator as a linear amplifier is disconnected and the sense amplifier based latched comparator 700 reverts to functioning as a comparator. During interval 920, the output, OUT, of the sense amplifier based latched comparator 700 is the value that was latched during the previous iteration of the recited input offset cancellation technique. With reference to FIGS. 8 and 9, during interval 930, the PHI2 control signal goes low and the PHI3 control signal goes high. During interval 930, the inputs to the latch component of the sense amplifier based latched comparator 800 are resolved, with the resolved value is provided as an output, OUT, of the comparator.

FIG. 10 is circuit diagram of the latched comparator 1000 component of a sense amplifier based latched comparator according to various embodiments. FIG. 10 illustrates the role of the three of control signals PHI1, PHI2 and PHI3 in the configuration of the latched comparator. The latched comparator 1000 is a CMOS circuit that includes cross-coupled PMOS and NMOS transistors 1020, 1030, 1040, 1050 and a differential pair of input transistors 1080 and 1090, each transistor controlled by inputs INP and INM, respectively. The latched comparator 1000 also includes a latch component 1010 that is configured to resolve the voltages on the S and R input terminals, store the difference between the resolved values of S and R, and provide this difference as an output signal, Q.

When the PHI1 control signal is high, such as during interval 910, the latched comparator 1000 is reconfigured as a linear amplifier in part by the operation of the PHI1, PHI2 and PHI3 controlled switches of the latched comparator. In one aspect of this reconfiguration of latched comparator 1000 as a linear amplifier, the toggling of PHI1 switches results in the supply of tail current source 1085 triggering the gate of transistor 1095, and along with the operation of the PHI1 switch connecting the two pairs of cross-coupled transistors 1020, 1030, 1040, 1050, provides identical current to the cross-coupled transistors. As described with respect to FIGS. 6-9, during intervals where PHI1 is logically high, the offset of inputs, INP and INM, of the latched comparator 1000 are sampled and this sampled offset amount is subtracted from the INP input terminal, thus cancelling the offset between the INP and INM inputs to the latched comparator.

When the PHI1 control signal goes low and the PHI2 control signal goes high, during interval 920, the latched comparator 1000 is reconfigured as a comparator and the inputs to terminals S and R of the latch 1010 are reset. During this reset the inputs to the S and R terminals are shorted by the operation of the PHI2 switches, such that these two inputs are equalized. The duration of interval 920 is selected to allow sufficient time for the inputs to terminals S and R to be reset and to reach a steady-state. During interval 920, the PHI2 control signal is high, which grounds the gate terminal of transistor 1095.

When the PHI2 control signal goes low and the PHI3 control signal goes high, during interval 930, the latch 1010 resolves the values of the inputs at the S and R terminals. By the operation of the PHI3 switches, the difference between the INP and INM inputs is magnified, resulting in a differential inputs on the S and R inputs to the latch component 1010. If the voltage on input terminal INP is greater than the voltage on terminal INM, the S terminal will resolve to a logical low value and the R terminal will resolve to a logical high. Conversely, when the voltage on input terminal INP is less than the voltage on terminal INM, the S terminal will resolve to logical high value and the R terminal will resolve to a low value. The duration of interval 930 is selected to allow sufficient time for the inputs to terminals S and R to be resolved and stored by the latch 1010. During interval 930, the PHI3 control signal is high, which connects the gate terminal of transistor 1095 to a supply voltage.

FIG. 11 illustrates the circuit diagram of an additional embodiment of an latched comparator 1100 that is configured to utilize an additional gain stage is situations where the configured linear amplifier does not generate sufficient gain. As with the embodiment of FIG. 10, the latched comparator is a CMOS circuit that includes cross-coupled PMOS and NMOS transistors 1120, 1130, 1140, 1150 and a differential pair of input transistors 1180 and 1190, each transistor controlled by inputs INP and INM, respectively. The latched comparator 1100 also includes a latch component 1110 that is configured to resolve the voltages on the S and R input terminals, store the difference between the resolved values of S and R, and provide this difference as an output signal, Q.

The latched comparator 1100 operates in the same manner as the embodiment with FIG. 10 with respect the PHI1, PHI2 and PHI3 control signals, except for the configuration of an additional gain component 1175 by switches 1165 and 1155 during the sampling and cancelling interval when PHI1 is logically high. The latched comparator 1100 employing this additional gain component 1175 may be especially useful in scenarios where the INM and INP inputs are generated by relatively high voltage components (potentially operating at 7V or 5V) and the load connected to the latched comparator is a relatively low voltage component (potentially operating at 1.5V or 1.2V). In such scenarios, the offset in the inputs, INM and INP, will be dominated by the high-voltage input devices, thus resulting in low gain by the configured linear amplification stage used by the latched comparator 1100.

In another embodiment, the recited input offset cancellation is combined with an algorithmic process for cancelling the remaining residual offset. The fraction of the total offset of the load that is cancelled by the above-described embodiments is provided by $V_{OFF}*g_m$ (load)/$g_m$ (input). The residual offset is $V_{OFF}*(1-g_m$ (load)/$g_m$ (input)). The sense amplifier based latched comparator according to various embodiments such as described with respect to FIGS. 6-11 is able to completely cancel the offset in the inputs, INM and INP, to the latched comparator. However, residual offset in the load connected to the latched comparator may remain. In certain embodiments, an additional stage is incorporated for cancellation of this residual offset using an algorithmic process. The magnitude of the residual offset is determined in a pre-processing stage and stored. This stored residual offset is then subtracted from the outputs to the latch component of the latched comparator. Since this algorithmic cancellation process is limited to canceling of residual offset, it results in only an insignificant loss of range compared to conventional algorithmic offset cancellation techniques.

The various described embodiments provide significant improvements over conventional input offset cancellation with regard to speed and power consumption. As described, conventional input offset cancellation techniques rely on a linear preamplifier stage. By utilizing a single integrated comparator component that can be reconfigured to function as a linear amplifier, significantly smaller and faster components can be utilized. In addition, when compared to conventional use of a preamplifier stage, embodiments provide improved linearity in the cancellation of input offset to a comparator device. Due to integration of the linear amplifier, the input capacitance of the comparator is lowered compared to conventional offset cancellation techniques that utilize a separate preamplifier stage. By lowering the input capacitance, smaller capacitors can be utilized, thus further improving the speed of the offset cancellation.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

The invention claimed is:

1. A latched comparator comprising:
   a first transistor;
   a second transistor having a drain coupled to a drain of the first transistor;
   a third transistor;
   a fourth transistor having a drain coupled to a drain of the third transistor, the drains of the first and second transistors being coupled to gates of the third and fourth transistors;
   a fifth transistor coupled to a source of the second transistor;
   a sixth transistor coupled to a source of the fourth transistor;
   a first switch coupled between the drains of the first and second transistors and gates of the first and second transistors;
   a second switch coupled between the drains of the third and fourth transistors and the gates of the first and second transistors;
   a third switch coupled between sources of the second and fourth transistors;
   a fourth switch coupled between a gate of the sixth transistor and the drain of the fourth transistor;
   a capacitor having a first and second terminal, the first terminal coupled to the gate of the sixth transistor; and
   a fifth switch coupled between the second terminal of the capacitor and a first reference voltage.

2. The latched comparator of claim 1, further comprising:
   a latch having a first input coupled to the drains of the first and second transistors, and a second input coupled to the drains of the third and fourth transistors.

3. The latched comparator of claim 2, wherein the latch is an SR latch.

4. The latched comparator of claim 1, further comprising:
   a current source coupled to the fifth and sixth transistors.

5. The latched comparator of claim 1, further comprising a sixth switch coupled between the second terminal of the capacitor and a input voltage.

6. The latched comparator of claim 1, further comprising a seventh transistor coupled to the source of the fifth transistor and to the source of the sixth transistor.

7. The latched comparator of claim 6, further comprising a seventh switch coupled between a gate of the seventh transistor and ground.

8. The latched comparator of claim 6, further comprising a seventh switch coupled between a gate of the seventh transistor and a second reference voltage.

* * * * *